United States Patent
Tada

(10) Patent No.: US 12,364,091 B2
(45) Date of Patent: Jul. 15, 2025

(54) DETECTION DEVICE

(71) Applicant: Japan Display Inc., Tokyo (JP)

(72) Inventor: Masahiro Tada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/607,771

(22) Filed: Mar. 18, 2024

(65) Prior Publication Data

US 2024/0324259 A1    Sep. 26, 2024

(30) Foreign Application Priority Data

Mar. 24, 2023    (JP) ................. 2023-048006

(51) Int. Cl.
*H10K 39/32*    (2023.01)
*G06V 40/13*    (2022.01)
*H04N 25/79*    (2023.01)

(52) U.S. Cl.
CPC ......... *H10K 39/32* (2023.02); *G06V 40/1318* (2022.01); *H04N 25/79* (2023.01)

(58) Field of Classification Search
CPC ..... H10K 39/32; G06V 40/1318; H04N 25/79
See application file for complete search history.

(56) References Cited

U.S. PATENT DOCUMENTS

| | | | |
|---|---|---|---|
| 2007/0075252 A1 | 4/2007 | Misawa | |
| 2009/0027358 A1 | 1/2009 | Hosono | |
| 2017/0186788 A1* | 6/2017 | Yen | H01L 27/14636 |
| 2019/0074307 A1* | 3/2019 | Kita | H04N 25/76 |
| 2021/0257415 A1* | 8/2021 | Kaneda | H01L 27/14612 |
| 2021/0384453 A1 | 12/2021 | Kawata | |
| 2023/0028839 A1* | 1/2023 | Koide | H10K 30/81 |

FOREIGN PATENT DOCUMENTS

| | | |
|---|---|---|
| JP | 2007-097693 A | 4/2007 |
| JP | 2009-032005 A | 2/2009 |
| WO | WO2020/188959 A1 | 9/2020 |

* cited by examiner

*Primary Examiner* — Lixi C Simpson
(74) *Attorney, Agent, or Firm* — K&L Gates LLP

(57) ABSTRACT

According to an aspect, a detection device includes: a substrate; and a plurality of optical sensors formed by stacking first and second lower electrodes, a lower buffer layer, an active layer, an upper buffer layer, and an upper electrode on the substrate in the order as listed. The first lower electrodes are arranged so as to be separated for each of the optical sensors. The second lower electrodes are provided so as to surround the first lower electrodes, respectively. The lower buffer layer, the active layer, the upper buffer layer, and the upper electrode are provided continuously over the optical sensors so as to cover the first and the second lower electrodes.

8 Claims, 7 Drawing Sheets

DETECTION DEVICE

CROSS-REFERENCE TO RELATED APPLICATION

This application claims the benefit of priority from Japanese Patent Application No. 2023-048006 filed on Mar. 24, 2023, the entire contents of which are incorporated herein by reference.

BACKGROUND

1. Technical Field

What is disclosed herein relates to a detection device.

2. Description of the Related Art

Optical sensors capable of detecting fingerprint patterns and vascular patterns are known (for example, Japanese Patent Application Laid-open Publication No. 2009-032005). Among such optical sensors, sensors are known each including a plurality of photodiodes (organic photodiodes (OPDs)) each including an organic semiconductor material used as an active layer. As described in International Patent Application Publication No. WO/2020/188959, in each of the photodiodes, for example, a lower electrode, an electron transport layer, an active layer, a hole transport layer, and an upper electrode are stacked in this order.

Japanese Patent Application Laid-open Publication No. 2007-097693 discloses an X-ray imaging device that includes, as an imaging element, an organic photosensitive layer that photoelectrically converts incident light, and has at least two areas of a higher-resolution image capturing area and a lower-resolution image capturing area.

Such optical sensors that include the OPDs are required to have higher detection accuracy.

For the foregoing reasons, there is a need for a detection device capable of improving the detection accuracy.

SUMMARY

According to an aspect, a detection device includes: a substrate; and a plurality of optical sensors formed by stacking first and second lower electrodes, a lower buffer layer, an active layer, an upper buffer layer, and an upper electrode on the substrate in the order as listed. The first lower electrodes are arranged so as to be separated for each of the optical sensors. The second lower electrodes are provided so as to surround the first lower electrodes, respectively. The lower buffer layer, the active layer, the upper buffer layer, and the upper electrode are provided continuously over the optical sensors so as to cover the first and the second lower electrodes.

DETAILED DESCRIPTION

Figure 1:
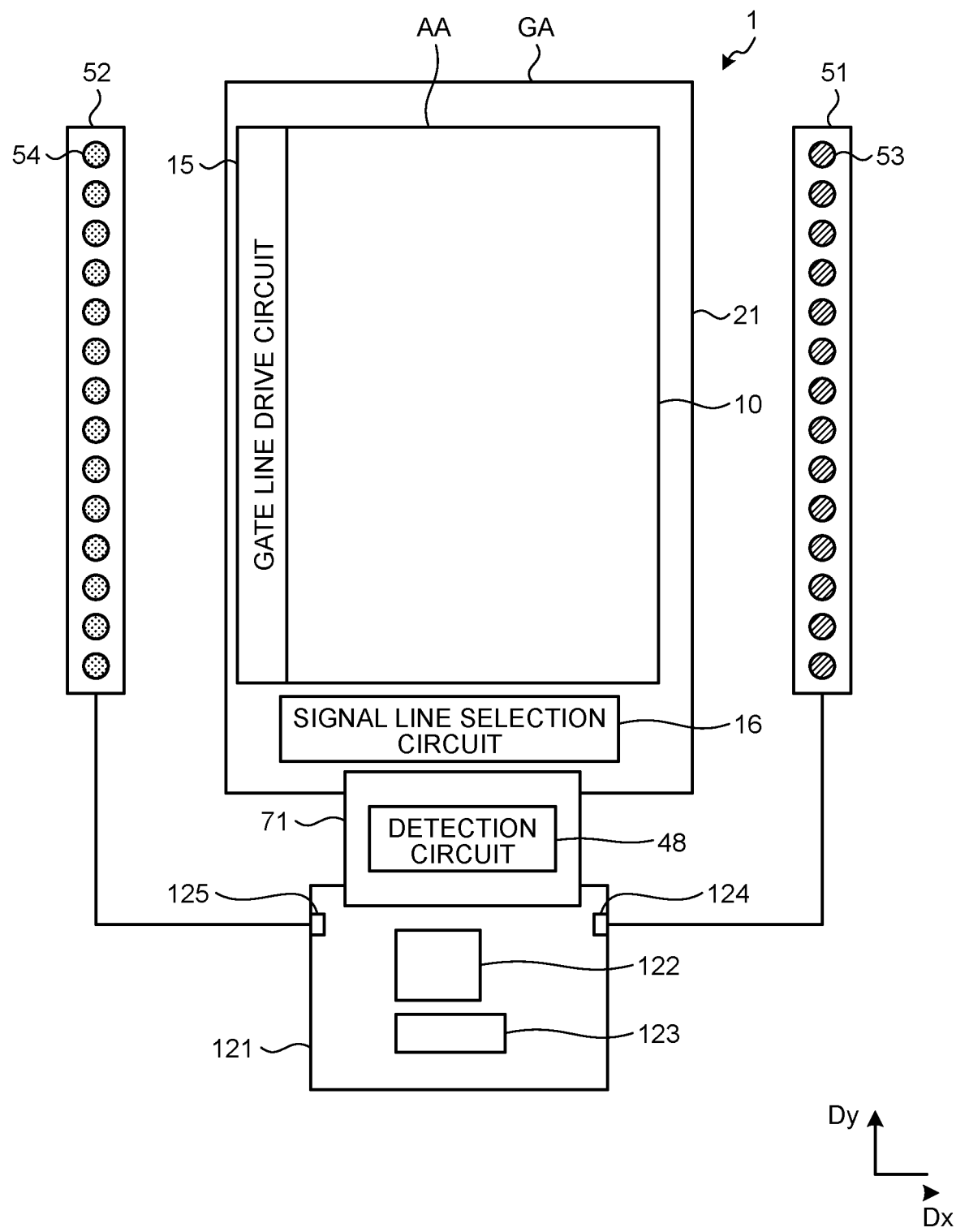
FIG. 1 is a plan view schematically illustrating a detection device according to an embodiment.

The following describes a mode (embodiment) for carrying out the present disclosure in detail with reference to the drawings. The present disclosure is not limited to the description of the embodiment given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

Embodiment

FIG. 1 is a plan view illustrating a detection device according to an embodiment. As illustrated in FIG. 1, a detection device 1 includes a substrate 21, a sensor 10, a gate line drive circuit 15, a signal line selection circuit 16, a detection circuit 48, a control circuit 122, a power supply circuit 123, a first light source base member 51, a second light source base member 52, and light sources 53 and 54. The first light source base member 51 is provided with a plurality of the light sources 53. The second light source base member 52 is provided with a plurality of the light sources 54.

The substrate 21 is electrically coupled to a control substrate 121 through a wiring substrate 71. The wiring substrate 71 is, for example, a flexible printed circuit board or a rigid circuit board. The wiring substrate 71 is provided with the detection circuit 48. The control substrate 121 is provided with the control circuit 122 and the power supply circuit 123. The control circuit 122 is, for example, a field-programmable gate array (FPGA). The control circuit 122 supplies control signals to the sensor 10, the gate line drive circuit 15, and the signal line selection circuit 16 to control a detection operation of the sensor 10. The control circuit 122 supplies control signals to the light sources 53 and 54 to control lighting and non-lighting of the light sources 53 and 54. The power supply circuit 123 supplies voltage signals including, for example, a precharge potential Vpr, a common potential Vcom, and a shield potential Vsh (refer to FIG. 3) to the sensor 10, the gate line drive circuit 15, and the signal line selection circuit 16. The power supply circuit 123 supplies a power supply voltage to the light sources 53 and 54.

The substrate 21 has a detection region AA and a peripheral region GA. The detection region AA is a region provided with a plurality of optical sensors PD (refer to FIG. 4) included in the sensor 10. The peripheral region GA is a region between the outer perimeter of the detection region AA and the outer edges of the substrate 21, and is a region not provided with the optical sensors PD.

The gate line drive circuit 15 and the signal line selection circuit 16 are provided in the peripheral region GA. Specifically, the gate line drive circuit 15 is provided in a region extending along a second direction Dy in the peripheral region GA. The signal line selection circuit 16 is provided in a region extending along a first direction Dx in the peripheral region GA, and is provided between the sensor 10 and the detection circuit 48.

In the following description, the first direction Dx is one direction in a plane parallel to the substrate 21. The second direction Dy is one direction in the plane parallel to the substrate 21 and is a direction orthogonal to the first direction Dx. The second direction Dy may non-orthogonally intersect the first direction Dx. A third direction Dz is a direction orthogonal to the first direction Dx and the second direction Dy, and is a direction normal to the principle surface of the substrate 21. The term "plan view" refers to a positional relation when viewed from a direction orthogonal to the substrate 21.

The light sources 53 are provided on the first light source base member 51, and arranged along the second direction Dy. The light sources 54 are provided on the second light source base member 52, and arranged along the second direction Dy. The first light source base member 51 and the second light source base member 52 are electrically coupled, through respective terminals 124 and 125 provided on the control substrate 121, to the control circuit 122 and the power supply circuit 123.

For example, inorganic light-emitting diodes (LEDs) or organic electroluminescent (EL) diodes (organic light-emitting diodes (OLEDs)) are used as the light sources 53 and 54. The light sources 53 and 54 emit light having wavelengths different from each other.

First light emitted from the light sources 53 is mainly reflected on a surface of an object to be detected, such as a finger, and is incident on the sensor 10. As a result, the sensor 10 can detect a fingerprint by detecting a shape of asperities on the surface of the finger or the like. Second light emitted from the light sources 54 is mainly reflected in the finger or the like, or transmitted through the finger or the like, and is incident on the sensor 10. As a result, the sensor 10 can detect information on a living body in the finger or the like. Examples of the information on the living body include pulse waves, pulsation, and a vascular image of the finger or a palm. That is, the detection device 1 may be configured as a fingerprint detection device to detect a fingerprint or a vein detection device to detect a vascular pattern of, for example, veins.

The arrangement of the light sources 53 and 54 illustrated in FIG. 1 is merely an example, and can be changed as appropriate. The detection device 1 is provided with a plurality of types of the light sources 53 and 54 as light sources. However, the light sources are not limited thereto, and may be of one type. For example, the light sources 53 and 54 may be arranged on each of the first and the second base members 51 and 52. The light sources 53 and 54 may be provided on one light source base member, or three or more light source base members. Alternatively, only at least one light source needs to be disposed.

Figure 2:
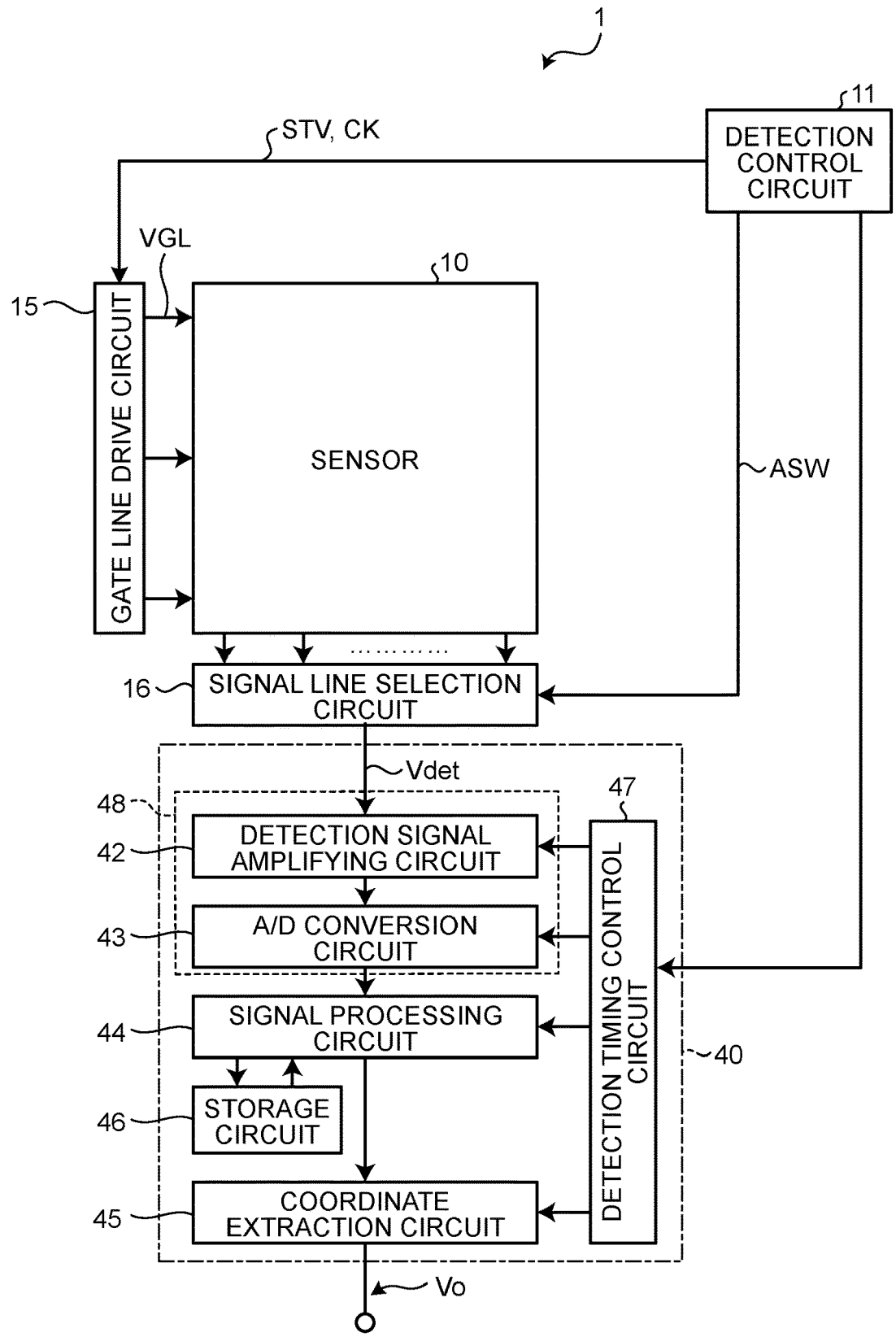
FIG. 2 is a block diagram illustrating a configuration example of the detection device according to the embodiment.

FIG. 2 is a block diagram illustrating a configuration example of the detection device according to the embodiment. As illustrated in FIG. 2, the detection device 1 further includes a detection control circuit 11 and a detector (detection signal processing circuit) 40. The control circuit 122 includes one, some, or all functions of the detection control circuit 11. The control circuit 122 also includes one, some, or all functions of the detector 40 other than those of the detection circuit 48.

The sensor 10 includes the optical sensors PD. Each of the optical sensors PD included in the sensor 10 outputs an electrical signal corresponding to light emitted thereto as a detection signal Vdet to the signal line selection circuit 16. The sensor 10 performs detection according to a gate drive signal VGL supplied from the gate line drive circuit 15.

The detection control circuit 11 supplies respective control signals to the gate line drive circuit 15, the signal line selection circuit 16, and the detector 40 to control operations of these components. The detection control circuit 11 supplies various control signals including, for example, a start signal STV and a clock signal CK to the gate line drive circuit 15. The detection control circuit 11 also supplies various control signals including, for example, a selection signal ASW to the signal line selection circuit 16. The detection control circuit 11 also supplies various control signals to the light sources 53 and 54 to control the lighting and non-lighting of the respective light sources 53 and 54.

The gate line drive circuit 15 drives a plurality of gate lines GL (refer to FIG. 3) based on the various control signals. The gate line drive circuit 15 sequentially or simultaneously selects the gate lines GL, and supplies the gate drive signals VGL to the selected gate lines GL. By this operation, the gate line drive circuit 15 selects the optical sensors PD coupled to the gate lines GL.

Figure 3:
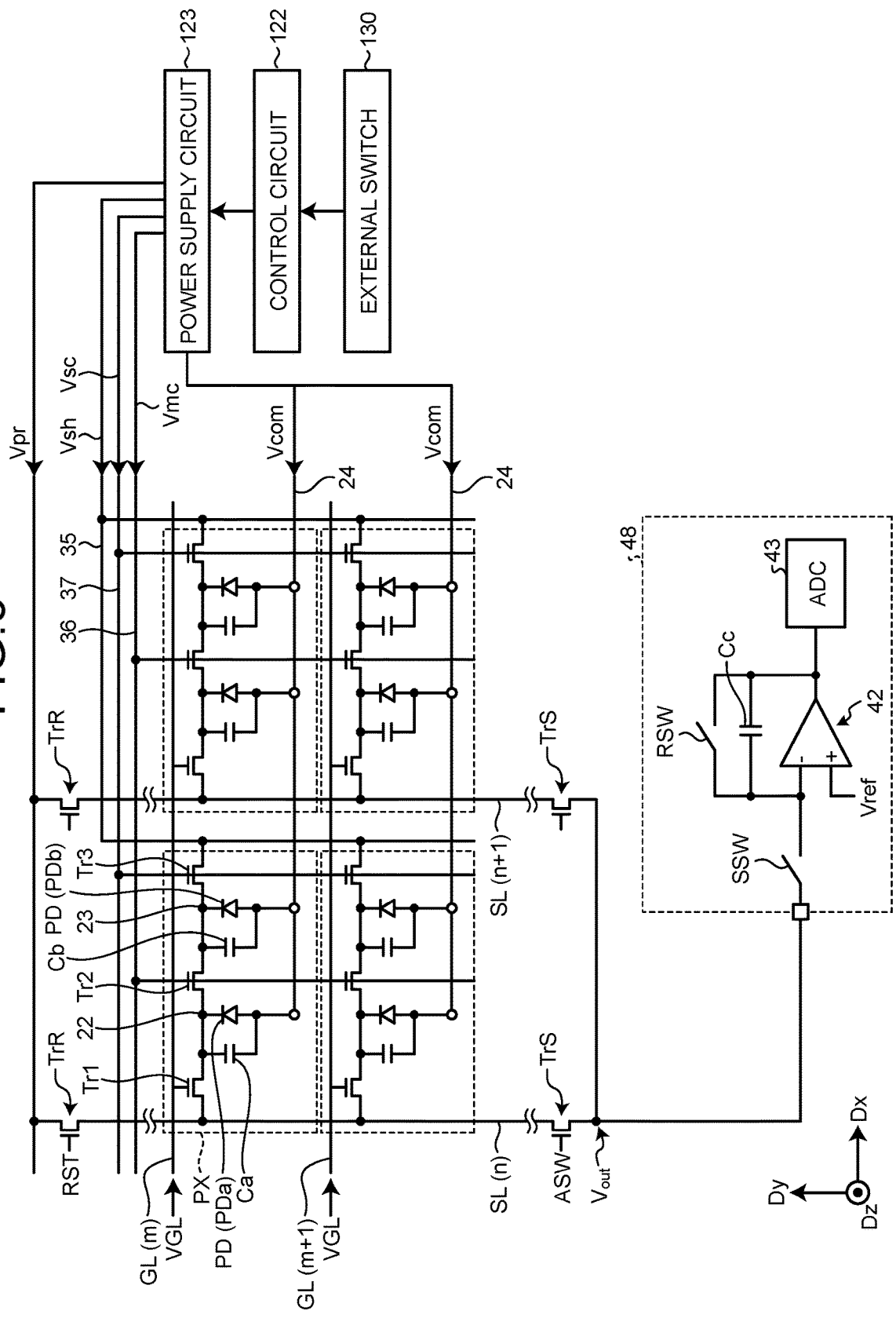
FIG. 3 is a circuit diagram illustrating the detection device according to the embodiment.

The signal line selection circuit 16 includes a switch circuit that sequentially or simultaneously selects a plurality of signal lines SL (refer to FIG. 3). The signal line selection circuit 16 is, for example, a multiplexer. The signal line selection circuit 16 couples the selected signal lines SL to the detection circuit 48 based on the selection signal ASW supplied from the detection control circuit 11. By this operation, the signal line selection circuit 16 outputs the detection signals Vdet of the optical sensors PD to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet. The A/D conversion circuit 43 converts an analog signal output from the detection signal amplifying circuit 42 into a digital signal.

The signal processing circuit 44 detects a predetermined physical quantity received by the sensor 10 based on output signals of the detection circuit 48. The signal processing circuit 44 is a logic circuit. The signal processing circuit 44 can detect the asperities on the surface of the finger or the palm based on the signals from the detection circuit 48 when the finger is in contact with or in proximity to a detection surface. The signal processing circuit 44 can detect the information on the living body based on the signals from the detection circuit 48. Examples of the information on the living body include the vascular image, the pulse waves, the pulsation, and a blood oxygen level of the finger or the palm.

The storage circuit 46 temporarily stores therein signals calculated by the signal processing circuit 44. The storage circuit 46 may be, for example, a random-access memory (RAM) or a register circuit.

The coordinate extraction circuit 45 obtains detected coordinates of the asperities on the surface of the finger or the like when the contact or proximity of the finger is detected by the signal processing circuit 44. The coordinate extraction circuit 45 also obtains detected coordinates of blood vessels in the finger or the palm. The coordinate extraction circuit 45 is a logic circuit. The coordinate extraction circuit 45 combines the detection signals Vdet output from the optical sensors PD of the sensor 10 to generate two-dimensional information indicating the shape of the asperities on the surface of the finger or the like and two-dimensional information indicating the shape of the blood vessels in the finger or the palm. The coordinate extraction circuit 45 may output the detection signals Vdet as sensor output voltages Vo instead of calculating the detected coordinates.

FIG. 3 is a circuit diagram illustrating the detection device according to the embodiment. FIG. 3 also illustrates a circuit configuration of the detection circuit 48. As illustrated in FIG. 3, a sensor pixel PX includes the optical sensor PD, capacitive elements Ca and Cb, a first transistor Tr1, a second transistor Tr2, and a third transistor Tr3.

Figure 5:
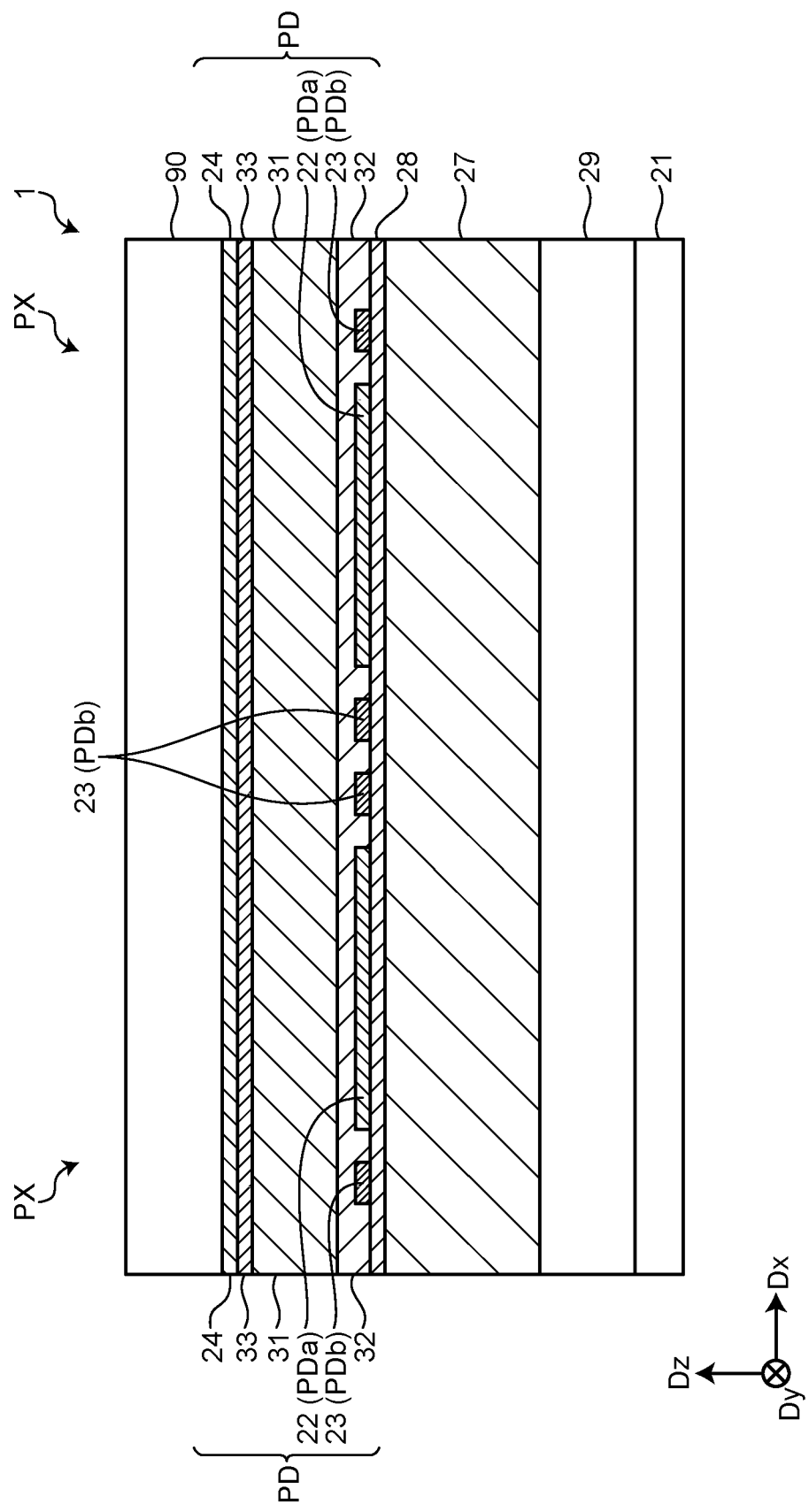
FIG. 5 is a sectional view along V-V' of FIG. 4.

The optical sensor PD of the present embodiment is an organic photodiode (OPD) using an organic semiconductor as an active layer 31 (refer to FIG. 5). The optical sensors PD include a main photodiode PDa and a sub-photodiode PDb. In the following description, the main photodiode PDa and the sub-photodiode PDb will each be simply referred to as the optical sensor PD when they need not be distinguished from each other.

In the sensor pixel PX, the main photodiode PDa and the sub-photodiode PDb are arranged in parallel.

Specifically, the anode of the main photodiode PDa and the anode of the sub-photodiode PDb are coupled together by an upper electrode 24 provided in common to the main photodiode PDa and the sub-photodiode PDb. The cathode (first lower electrode 22) of the main photodiode PDa and the cathode (second lower electrode 23) of the sub-photodiode PDb are arranged so as to be capable of being coupled to each other with the second transistor Tr2 interposed therebetween.

The capacitive elements Ca and Cb are capacitors (sensor capacitance) formed in the optical sensor PD. The capacitive element Ca is equivalently coupled in parallel with the main photodiode PDa. The capacitive element Cb is equivalently coupled in parallel with the sub-photodiode PDb.

The first transistor Tr1, the second transistor Tr2, and the third transistor Tr3 are provided correspondingly to each of the optical sensors PD (sensor pixels PX). In the following description, the first transistor Tr1, the second transistor Tr2, and the third transistor Tr3 will each be simply referred to as a transistor Tr when they need not be distinguished from one another.

The transistor Tr is formed of a thin-film transistor, and in this example, formed of an n-channel metal oxide semiconductor (MOS) thin-film transistor (TFT).

FIG. 3 illustrates two gate lines GL (m) and GL (m+1) arranged in the second direction Dy among the gate lines GL. FIG. 3 also illustrates two signal lines SL (n) and SL (n+1) arranged in the first direction Dx among the signal lines SL.

The gate lines GL each extend in the first direction Dx and are arranged with gaps interposed therebetween in the second direction Dy. The signal lines SL each extend in the second direction Dy and are arranged with gaps interposed therebetween in the first direction Dx. The optical sensors PD (sensor electrodes PX) are each provided in a region surrounded by two of the gate lines GL and two of the signal lines SL.

Each of the gate lines GL is coupled to the gates of the first transistors Tr1 arranged in the first direction Dx. Each of the signal lines SL is coupled to the sources or the drains of the first transistors Tr1 arranged in the second direction Dy. The other of the sources and the drains of the first transistors Tr1 are coupled to the cathodes (first lower electrodes 22) of the main photodiodes PDa and the capacitive elements Ca.

The gate of the second transistor Tr2 is coupled to a first control wiring line 36. In the sensor pixels PX in the present embodiment, the gates of the second transistors Tr2 are coupled to the first control wiring line 36 provided in common to the second transistors Tr2. The first control wiring line 36 supplies a detection mode control signal Vmc to the gates of the second transistors Tr2.

The cathode (first lower electrode 22) of the main photodiode PDa is coupled to one of the source and the drain of the second transistor Tr2. The cathode (second lower electrode 23) of the sub-photodiode PDb is coupled to the other of the source and the drain of the second transistor Tr2. That is, the second transistor Tr2 is a switch element that switches between coupling and non-coupling between the first lower electrode 22 and the second lower electrode 23.

A second control wiring line 37 is coupled to the gate of the third transistor Tr3. In the sensor pixels PX in the present embodiment, the gates of the third transistors Tr3 are coupled to the second control wiring line 37 provided in common to the third transistors Tr3. The second control wiring 37 supplies a shield control signal Vsc to the gates of the third transistors Tr3.

The cathode (second lower electrode 23) of the sub-photodiode PDb is coupled to one of the source and the drain of the third transistor Tr3. A shield potential supply wiring line 35 is coupled to the other of the source and the drain of the third transistor Tr3. That is, the third transistor Tr3 is a switch element that switches between coupling and non-coupling between the second lower electrode 23 and the shield potential supply wiring line 35 (potential supply wiring line). The shield potential supply wiring line 35 supplies the shield potential Vsh as a predetermined potential to the cathode (second lower electrode 23) of the sub-photodiode PDb via the third transistor Tr3.

The anode (upper electrode 24) of the optical sensor PD is supplied with the common potential Vcom from the power supply circuit 123. The signal line SL and the capacitive element Ca are supplied with the precharge potential Vpr, which serves as an initial potential of the signal line SL and the capacitive element Ca, from the power supply circuit 123 via a reset transistor TrR and the first transistor Tr1. The reset transistor TrR is controlled to be on or off based on a reset control signal RST. The optical sensor PD is driven in a reverse bias state by the common potential Vcom and the precharge potential Vpr. For example, the common potential Vcom is 0 V, and the precharge potential Vpr is set to 0.75 V.

The optical sensor PD has a first detection mode M1 and a second detection mode M2. In the first detection mode M1, the second transistors Tr2 are turned off (non-conduction state), and the third transistors Tr3 are turned on (conduction state). Specifically, the power supply circuit 123 supplies the detection mode control signal Vmc at a low-level voltage to the gates of the second transistors Tr2. This operation turns off the second transistors Tr2. The power supply circuit 123 supplies the shield control signal Vsc at a high-level voltage to the gates of the third transistors Tr3. This operation turns on the third transistors Tr3.

In the first detection mode M1, the cathode (first lower electrode 22) of the main photodiode PDa is decoupled from the cathode (second lower electrode 23) of the sub-photodiode PDb by the second transistor Tr2. The second lower electrode 23 is coupled to the shield potential supply wiring line 35 via the third transistor Tr3. This operation supplies the shield potential Vsh to the second lower electrode 23.

In the first detection mode M1, when the sensor pixel PX is irradiated with light in an exposure period, a current corresponding to the amount of the light flows through the main photodiode PDa of the optical sensor PD. As a result, an electric charge is stored in the capacitive element Ca. After the first transistor Tr1 is turned on in a read period, a current corresponding to the electric charge stored in the capacitive element Ca flows through the signal line SL. The signal line SL is coupled to the detection circuit 48 through an output transistor TrS of the signal line selection circuit 16. The output transistor TrS is controlled to be on or off for each of the signal lines SL based on the selection signal ASW. Thus, the detection device 1 can detect a signal corresponding to the amount of the light applied to the main photodiode PDa of the optical sensor PD for each of the sensor pixels PX.

As described above, the second transistor Tr2 is off and the second lower electrode 23 of the sub-photodiode PDb is not coupled to either the signal line SL or the detection circuit 48. That is, in the first detection mode M1, the sub-photodiode PDb does not serve as the optical sensor. The second lower electrode 23 is supplied with the shield potential Vsh and serves as a shield electrode between the adjacent sensor pixels PX (main photodiodes PDa).

In the second detection mode M2, the second transistor Tr2 is turned on (conduction state) and the third transistor Tr3 is turned off (non-conduction state). Specifically, the power supply circuit 123 supplies the detection mode control signal Vmc at a high-level voltage to the gates of the second transistors Tr2, thus turning on the second transistors Tr2. The power supply circuit 123 supplies the shield control signal Vsc at a low-level voltage to the gates of the third transistors Tr3, thus turning off the third transistors Tr3.

In the second detection mode M2, the cathode (first lower electrode 22) of the main photodiode PDa is coupled to the cathode (second lower electrode 23) of the sub-photodiode PDb via the second transistor Tr2. The second lower electrode 23 is decoupled from the shield potential supply wiring line 35 by the third transistor Tr3. As a result, the second lower electrode 23 is not supplied with the shield potential Vsh.

In the second detection mode M2, when the sensor pixel PX is irradiated with light in the exposure period, currents corresponding to the amounts of the light flow through the main photodiode PDa and the sub-photodiode PDb of the optical sensor PD. As a result, electric charges are stored in the capacitive elements Ca and Cb. After the first transistor Tr1 is turned on in the read period, a current corresponding to the electric charges stored in the capacitive elements Ca and Cb flows through the signal line SL. The signal line SL is coupled to the detection circuit 48 through the output transistor TrS of the signal line selection circuit 16. Thus, the detection device 1 can detect a signal corresponding to the amounts of the light applied to the main photodiode PDa and the sub-photodiode PDb of the optical sensor PD for each of the sensor pixels PX.

During the read period, a switch SSW is turned on to couple the detection circuit 48 to the signal line SL. The detection signal amplifying circuit 42 of the detection circuit 48 converts a current or an electric charge supplied from the signal line SL into a voltage corresponding thereto. A reference potential (Vref) having a fixed potential is supplied to a non-inverting input portion (+) of the detection signal amplifying circuit 42, and the signal lines SL are coupled to an inverting input portion (−) of the detection signal amplifying circuit 42. In the embodiment, the same voltage signal as the precharge potential Vpr is supplied as the reference potential (Vref). The control circuit 122 (refer to FIG. 1) calculates, as each of the sensor output voltages Vo, the difference between the detection signal Vdet when the optical sensor PD is irradiated with light and the detection signal Vdet when the optical sensor PD is not irradiated with light. The detection signal amplifying circuit 42 includes a capacitive element Cc and a reset switch RSW. During a reset period, the reset switch RSW is turned on to reset the electric charge of the capacitive element Cc.

Detailed operations of the optical sensor PD in the first and the second detection modes M1 and M2 will be described later with reference to FIGS. 6 and 7. The transistor Tr is not limited to being configured as an n-type TFT and may be configured as a p-type TFT. The pixel circuit of the sensor pixel PX illustrated in FIG. 3 is merely exemplary and can be changed as appropriate. For example, the number of the transistors Tr included in one sensor pixel PX is not limited to three, and four or more transistors Tr may be provided therein.

Switching between the first and the second detection modes M1 and M2 is performed based on input from an external switch 130. The external switch 130 may be any external switch, such as a pushbutton switch provided on a housing accommodating the detection device 1. Registers included in the control circuit 122 are set based on the input from the external switch 130. Based on a control signal from the control circuit 122, the detection mode control signal Vmc is supplied to the second transistor Tr2, and the second transistor Tr2 is controlled to be on or off. Based on a control signal from the control circuit 122, the shield control signal Vsc is supplied to the third transistor Tr3, and the third transistor Tr3 is controlled to be on or off.

The switching between the first and the second detection modes M1 and M2 is not limited to being performed based on the input from the external switch 130. For example, the switching between the first and the second detection modes M1 and M2 may be performed by setting the registers included in the control circuit 122 in advance. In this case, the registers included in the control circuit 122 are set in advance before shipment of the detection device 1 depending on, for example, the type of the object to be detected and the type of biometric information to be detected.

Figure 4:
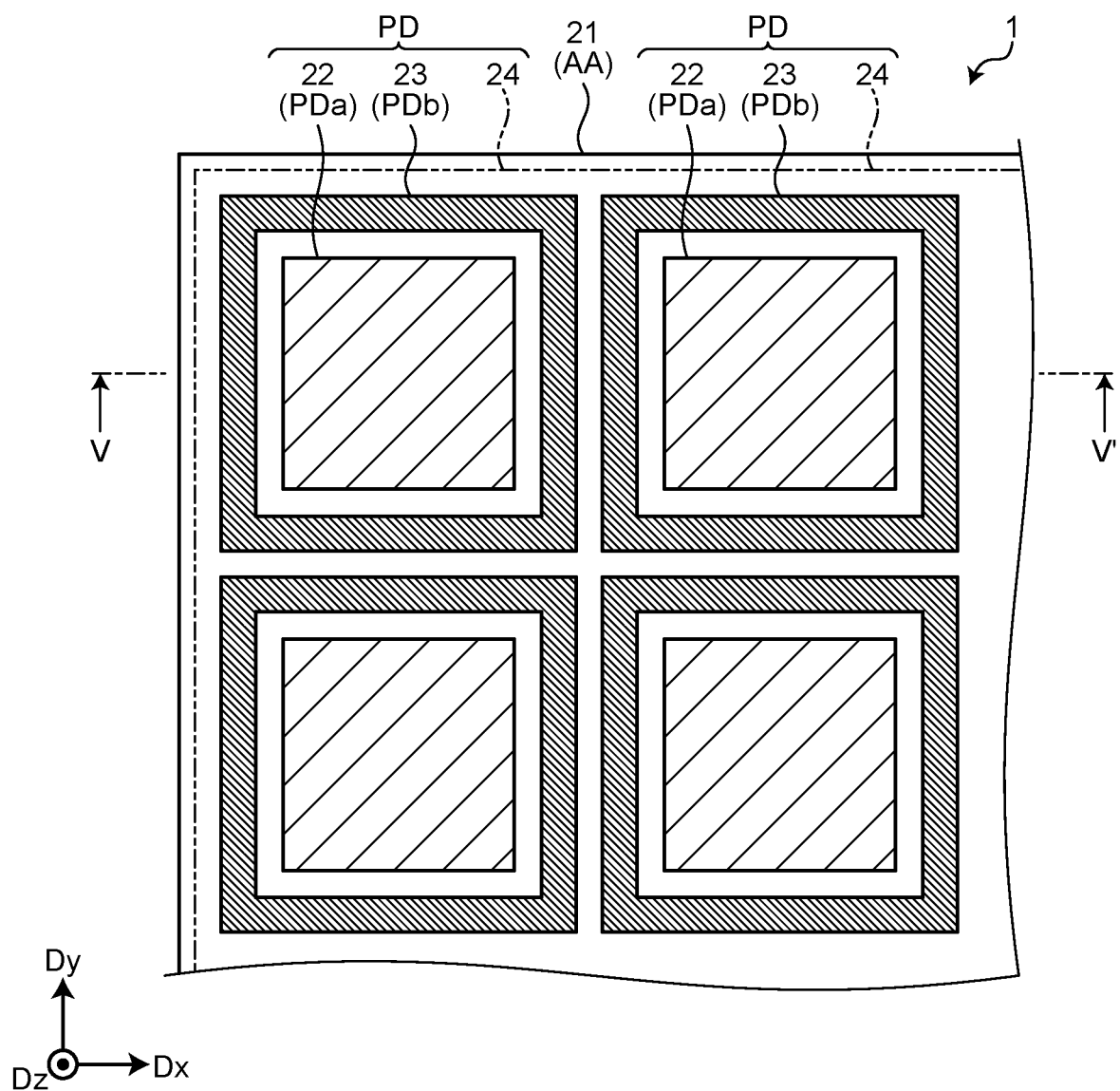
FIG. 4 is a plan view illustrating a plurality of optical sensors included in a sensor.

The following describes a configuration example of the optical sensors PD. FIG. 4 is a plan view illustrating the optical sensors included in the sensor. For ease of viewing, FIG. 4 illustrates each of the first lower electrode 22 and the second lower electrode 23 with hatching.

As illustrated in FIG. 4, the optical sensors PD are arranged in a matrix having a row-column configuration in the detection region AA of the substrate 21. The optical sensor PD includes the first lower electrode 22, the second lower electrode 23, and the upper electrode 24. The first and the second lower electrodes 22 and 23 are arranged so as to be separated for each of the optical sensors PD. The first lower electrode 22 is provided in an island shape in the detection region AA of the substrate 21. The second lower electrodes 23 are provided so as to surround the first lower electrodes 22, respectively. The upper electrode 24 is continuously provided over the optical sensors PD so as to cover the first lower electrodes 22 and the second lower electrodes 23.

More specifically, the first lower electrode 22 has a quadrilateral shape. The second lower electrode 23 has a ring shape surrounding the four sides of the first lower electrode 22. The second lower electrode 23 is located so as to be separate from the periphery of the first lower electrode 22. In other words, the first lower electrode 22 is located in a region overlapping an opening provided in the second lower electrode 23. In adjacent two of the optical sensors PD, the second lower electrode 23 of one of the optical sensors PD is adjacent to the second lower electrode 23 of the other of the optical sensors PD with a gap interposed therebetween.

In each of the optical sensors PD, a region overlapping the first lower electrode 22 corresponds to the main photodiode PDa described with reference to FIG. 3. A region overlapping the second lower electrode 23 corresponds to the sub-photodiode PDb described with reference to FIG. 3.

The shape of the first lower electrode 22 is not limited to the quadrilateral shape and may be another shape such as a circular shape or a polygonal shape. The shape of the second lower electrode 23 can also be changed according to the shape of the first lower electrode 22. The second lower electrode 23 is continuously provided, but is not limited thereto. For example, a slit may be provided in a portion of the second lower electrode 23, or the second lower electrode 23 may be divided into a plurality of portions.

FIG. 5 is a sectional view along V-V' of FIG. 4. As illustrated in FIG. 5, in the detection device 1, a circuit forming layer 29, an organic insulating film 27, an inorganic insulating film 28, the optical sensor PD, and a sealing film 90 are stacked in this order on the substrate 21.

In the following description, a direction from the substrate 21 toward the sealing film 90 in a direction orthogonal to a surface of the substrate 21 is referred to as "upward" or simply "above". A direction from the sealing film 90 toward the substrate 21 is referred to as "downward" or simply "below".

The substrate 21 is an insulating substrate and is made using, for example, a glass substrate of, for example, quartz or alkali-free glass. The substrate 21 is not limited to having a flat plate shape, but may have a curved surface. In this case, the substrate 21 may be a film-like resin material.

The circuit forming layer 29 is provided on the substrate 21. Although not illustrated, the transistors Tr and various types of wiring such as the gate lines GL and the signal lines SL illustrated in FIG. 3 are formed in the circuit forming layer 29. The organic insulating film 27 is provided on the circuit forming layer 29 and covers the transistors Tr and the various types of wiring in the circuit forming layer 29. The organic insulating film 27 is an organic planarizing film formed of an organic insulating material.

The inorganic insulating film 28 is provided on the organic insulating film 27. The inorganic insulating film 28 is a barrier film formed of an inorganic insulating material such as a silicon nitride film (SiN).

The optical sensor PD is provided on the inorganic insulating film 28. In more detail, the optical sensor PD includes the first lower electrode 22, the second lower electrode 23, a lower buffer layer 32, the active layer 31, an upper buffer layer 33, and the upper electrode 24. In the optical sensor PD, the first and the second lower electrodes 22 and 23, the lower buffer layer 32, the active layer 31, the upper buffer layer 33, and the upper electrode 24 are stacked in this order in the direction orthogonal to the substrate 21.

The first and the second lower electrodes 22 and 23 are provided in the same layer on the inorganic insulating film 28. The first lower electrode 22 is, for example, a cathode electrode of the main photodiode PDa. The second lower electrode 23 is, for example, a cathode electrode of the sub-photodiode PDb. The first and the second lower electrodes 22 and 23 are formed of a light-transmitting conductive material such as indium tin oxide (ITO) or indium zinc oxide (IZO).

The lower buffer layer 32, the active layer 31, the upper buffer layer 33, and the upper electrode 24 are provided continuously over the optical sensors PD so as to cover the first and the second lower electrodes 22 and 23. Specifically, the lower buffer layer 32, the active layer 31, the upper buffer layer 33, and the upper electrode 24 are provided in regions overlapping the first and the second lower electrodes 22 and 23, and also provided in regions between the adjacent first and second lower electrodes 22 and 23 and regions between the second lower electrodes 23 of the adjacent optical sensors PD.

The active layer 31 changes in characteristics (for example, voltage-current characteristics and resistance value) depending on light emitted thereto. An organic material is used as a material of the active layer 31. Specifically, the active layer 31 has a bulk heterostructure containing a mixture of a p-type organic semiconductor and an n-type fullerene derivative (PCBM) that is an n-type organic semiconductor. As the active layer 31, low-molecular-weight organic materials can be used including, for example, fullerene ($C_{60}$), phenyl-$C_{61}$-butyric acid methyl ester (PCBM), copper phthalocyanine (CuPc), fluorinated copper phthalocyanine ($F_{16}$CuPc), 5,6,11,12-tetraphenyltetracene (rubrene), and perylene diimide (PDI) (derivative of perylene).

The active layer 31 can be formed by a vapor deposition process (dry process) using the low-molecular-weight organic materials listed above. In this case, the active layer 31 may be, for example, a multilayered film of CuPc and $F_{16}$CuPc, or a multilayered film of rubrene and $C_{60}$. The active layer 31 can also be formed by a coating process (wet process). In this case, the active layer 31 is made using a material obtained by combining the above-listed low-molecular-weight organic materials with a high-molecular-weight organic material. As the high-molecular-weight organic material, for example, poly(3-hexylthiophene) (P3HT) and F8-alt-benzothiadiazole (F8BT) can be used. The active layer 31 can be a film made of a mixture of P3HT and PCBM, or a film made of a mixture of F8BT and PDI. The active layer 31 is not limited to having a bulk heterostructure, and may have a positive-intrinsic-negative (PIN) structure.

The lower buffer layer 32 or the upper buffer layer 33 is provided to facilitate holes or electrons generated in the active layer 31 to reach the first lower electrode 22, the second lower electrode 23, or the upper electrode 24. The lower buffer layer 32 is provided so as to be in direct contact with the top of the first and the second lower electrodes 22 and 23 and so as to cover the inorganic insulating film 28 between the adjacent first and second lower electrodes 22 and 23 and between the second lower electrodes 23 of the adjacent optical sensors PD.

The upper buffer layer 33 is in direct contact with the top of the active layer 31. In the present embodiment, the lower buffer layer 32 is an electron transport layer, and the upper buffer layer 33 is a hole transport layer. Polyethylenimine ethoxylated (PEIE) is used as a material of the electron transport layer. The material of the hole transport layer is an oxide metal layer. For example, tungsten oxide ($WO_3$) or molybdenum oxide is used as the oxide metal layer.

The upper electrode 24 is provided on the upper buffer layer 33. The upper electrode 24 is an anode electrode of the optical sensor PD and is continuously formed over the entire detection region AA. In other words, the upper electrode 24 is continuously provided in the top layer of the optical sensors PD. The upper electrode 24 faces the first lower electrodes 22 and the second lower electrodes 23 with the lower buffer layer 32, the active layer 31, and the upper buffer layer 33 interposed therebetween. The upper electrode 24 is formed of, for example, a light-transmitting conductive material such as ITO or IZO. The upper electrode 24 may be a multilayered film of a plurality of light-transmitting conductive materials.

The sealing film 90 is provided on the upper electrode 24. An inorganic film such as a silicon nitride film or an aluminum oxide film or a resin film of, for example, an acrylic resin is used as the sealing film 90. The sealing film 90 is not limited to a single layer, but may be a multilayered film having two or more layers obtained by combining the inorganic film with the resin film mentioned above. The sealing film 90 well seals the optical sensors PD and thus can restrain water from entering the optical sensors PD from the upper surface side thereof.

Figure 6:
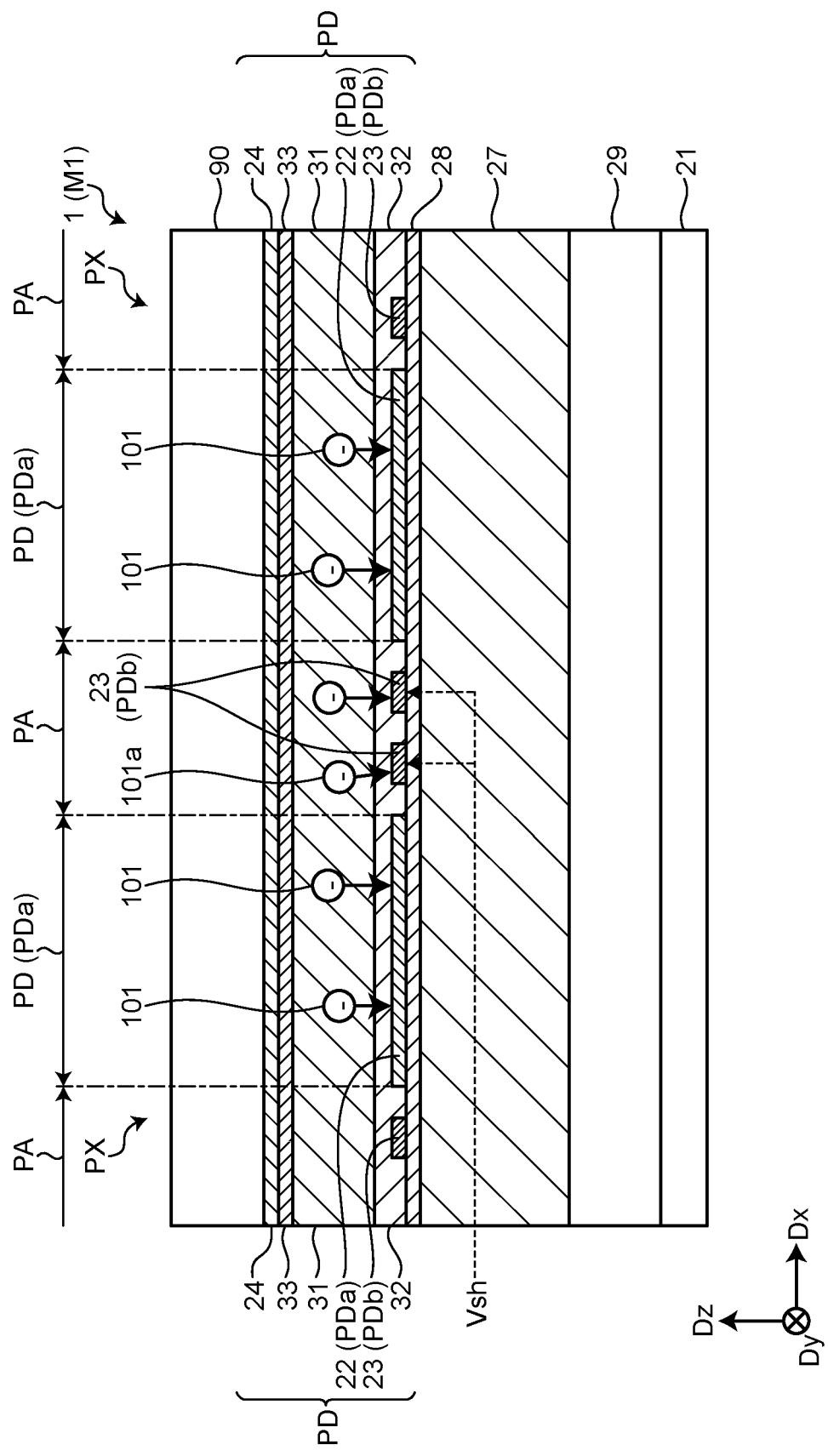
FIG. 6 is an explanatory view for explaining a first detection mode of the optical sensors.
Figure 7:
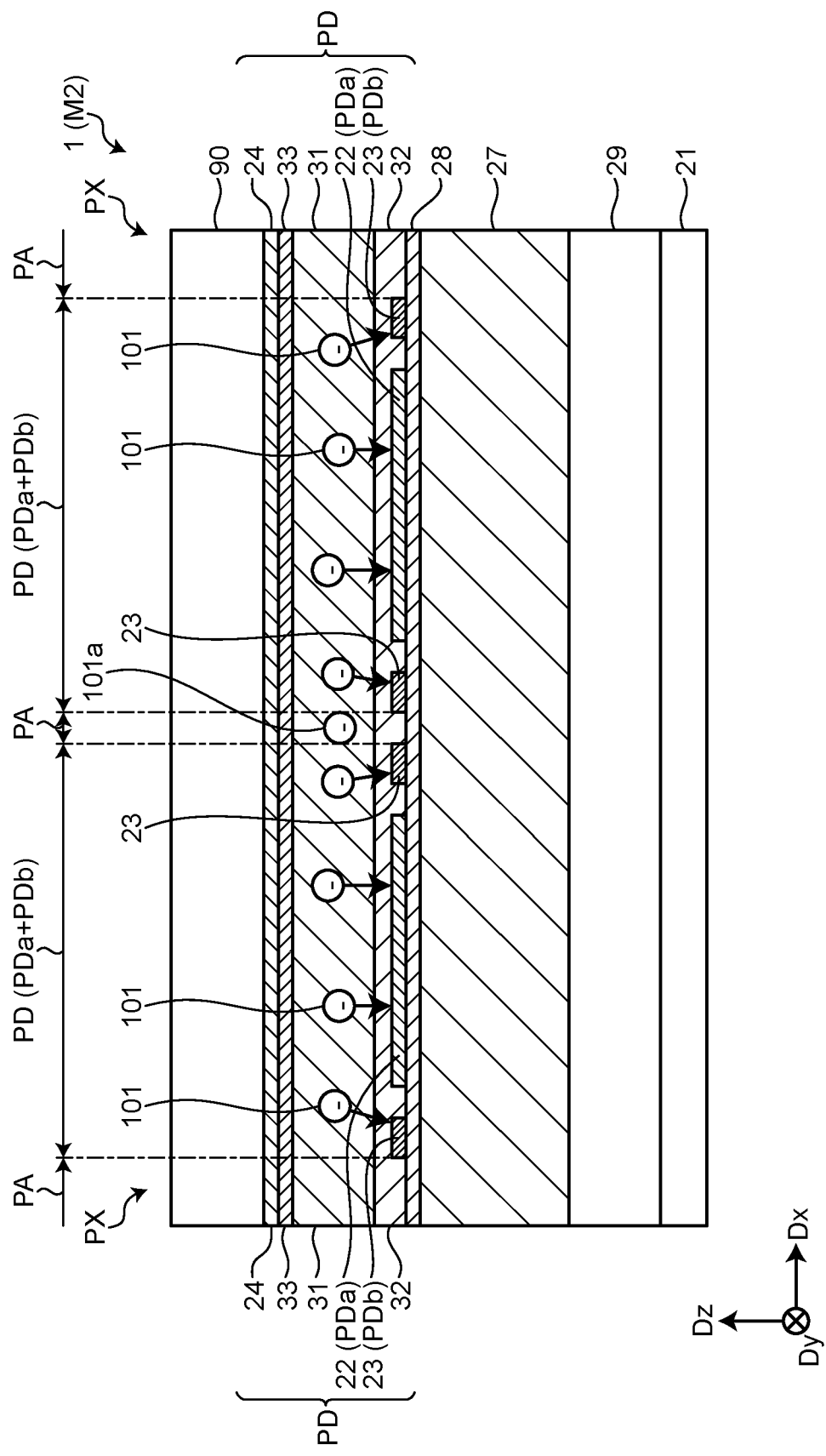
FIG. 7 is an explanatory view for explaining a second detection mode of the optical sensors.

The following describes the operations of the optical sensor PD in the first and the second detection modes M1 and M2 with reference to FIG. 3 and FIGS. 6 and 7. FIG. 6 is an explanatory view for explaining the first detection mode of the optical sensors.

As described above with reference to FIG. 3, in the first detection mode M1, the second transistor Tr2 is turned off and the third transistor Tr3 is turned on. That is, in the first detection mode M1, the first lower electrode 22 is decoupled from the second lower electrode 23 by the second transistor Tr2. The second lower electrode 23 is coupled to the shield potential supply wiring line 35 via the third transistor Tr3. The second lower electrode 23 is supplied with the shield potential Vsh via the shield potential supply wiring line 35. The shield potential Vsh is a predetermined fixed potential. The shield potential Vsh is more preferably equal to the precharge potential Vpr supplied to the first lower electrode 22.

As illustrated in FIG. 6, in the first detection mode M1, the main photodiode PDa including the first lower electrode 22 serves as the optical sensor PD, and the sub-photodiode PDb including the second lower electrode 23 virtually does not serve as the optical sensor PD. In the first detection mode M1, a region between the adjacent first lower electrodes 22 is referred to as an inter-pixel region PA. The inter-pixel region PA is a region that virtually does not serve as the optical sensor PD.

The light emitted from the light sources 53 and 54 (refer to FIG. 1) is reflected on or transmitted through the object to be detected and enters the active layer 31 of the optical sensor PD. Carriers 101 corresponding to the emitted light are generated in the active layer 31. The carriers 101 generated in a region of the active layer 31 overlapping the first lower electrode 22 (main photodiode PDa) flow through the lower buffer layer 32 to the first lower electrode 22. The first lower electrode 22 is coupled to the detection circuit 48 via the first transistor Tr1, the signal line SL, and the output transistor TrS (refer to FIG. 3).

In the first detection mode M1, as described above, the second lower electrode 23 is decoupled from the first lower electrode 22 and is supplied with the shield potential Vsh serving as a fixed potential. As a result, carriers 101a generated in a region of the active layer 31 located in the inter-pixel region PA flow through the lower buffer layer 32 to the second lower electrode 23. As a result, the carriers 101a generated in the region of the active layer 31 located in the inter-pixel region PA are restrained from flowing toward the first lower electrode 22.

If the second lower electrode 23 is not provided, the response of the carriers 101a generated in the region of the active layer 31 in the inter-pixel region PA to reach the first lower electrode 22 may be delayed compared with that of the carriers 101 generated in the region of the active layer 31 overlapping the first lower electrode 22 (main photodiode PDa).

In the first detection mode M1, since the second lower electrode 23 is provided, the response speed in the region overlapping the first lower electrode 22 (main photodiode PDa) can be increased, and the leakage of the carriers 101 between the first lower electrodes 22 of the adjacent sensor pixels PX (optical sensors PD) can be reduced. By causing the shield potential Vsh supplied to the second lower electrode 23 to be equal to the precharge potential Vpr supplied to the first lower electrode 22, the leakage of the carriers 101 between the adjacent first and second lower electrodes 22 and 23 can be reduced. As a result, in the first detection mode M1, the resolution of the optical sensor PD can be improved.

FIG. 7 is an explanatory view for explaining the second detection mode of the optical sensors. As described above with reference to FIG. 3, in the second detection mode M2, the second transistor Tr2 is turned on and the third transistor Tr3 is turned off. That is, in the second detection mode M2, the first lower electrode 22 is coupled to the second lower electrode 23 via the second transistor Tr2, and the second lower electrode 23 is decoupled from the shield potential supply wiring line 35 by the third transistor Tr3.

As illustrated in FIG. 7, in the second detection mode M2, both the main photodiode PDa including the first lower electrode 22 and the sub-photodiode PDb including the second lower electrode 23 serve as the optical sensor PD. In the second detection mode M2, a region between the second lower electrodes 23 of the adjacent sensor pixels PX (optical sensors PD) serves as the inter-pixel region PA.

The carriers 101 generated in the region of the active layer 31 overlapping the first lower electrode 22 (main photodiode PDa) flow through the lower buffer layer 32 to the first lower electrode 22. The carriers 101 generated in the region of the active layer 31 overlapping the second lower electrode 23 (sub-photodiode PDb) flow through the lower buffer layer 32 to the second lower electrode 23. The carriers 101 generated in the regions of the active layer 31 between the first and the second lower electrodes 22 and 23 flow through the lower buffer layer 32 to the first lower electrode 22 or the second lower electrode 23. The first and the second lower electrodes 22 and 23 are coupled to the detection circuit 48 via the first transistor Tr1, the signal line SL, and the output transistor TrS (refer to FIG. 3).

In the second detection mode M2, the effective width (area) of the optical sensor PD is larger than that in the first detection mode M1, which can improve the optical sensitivity. In the second detection mode M2, the width (area) of the inter-pixel region PA that does not serve as the optical sensor PD is smaller, and the amount of the carriers 101*a* generated in the region of the active layer 31 located in the inter-pixel region PA is smaller than in the first detection mode M1. As a result, the optical response speed of the optical sensor PD can be improved in the second detection mode M2.

As described above, the detection device 1 according to the present embodiment is adaptable to both cases where a high resolution is required (first detection mode M1) and where a high optical response speed is required (second detection mode M2). Examples of the case where the high resolution is required include cases where the detection device 1 detects images of, for example, fingerprints or blood vessels. Examples of the case where the high optical response speed is required include cases where the detection device 1 detects pulse waves, pulsation, heartbeats, or the like.

The configuration of the optical sensors PD illustrated in FIGS. 4 to 7 is merely exemplary and can be changed as appropriate. For example, the materials and the manufacturing methods of the lower buffer layer 32, the active layer 31, and the upper buffer layer 33 are merely exemplary, and other materials and manufacturing methods may be used. For example, each of the lower buffer layer 32 and the upper buffer layer 33 is not limited to a single-layer film, and may be formed as a multilayered film that includes an electron block layer and a hole block layer. For example, the upper electrode 24 may be a cathode electrode of the optical sensor PD, and the first and the second lower electrodes 22 and 23 may be anode electrodes of the optical sensor PD. In that case, the lower buffer layer 32 is a hole transport layer and the upper buffer layer 33 is an electron transport layer.

While the preferred embodiment of the present disclosure has been described above, the present disclosure is not limited to the embodiment described above. The content disclosed in the embodiment is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiments and the modifications described above.

What is claimed is:

1. A detection device comprising:
    a substrate;
    a plurality of optical sensors formed by stacking first and second lower electrodes, a lower buffer layer, an active layer, an upper buffer layer, and an upper electrode on the substrate in the order as listed;
    a potential supply wiring line configured to supply a predetermined potential to the second lower electrode; and
    a first transistor configured to switch between coupling and non-coupling between the second lower electrode and the potential supply wiring line, wherein
    the first lower electrodes are arranged so as to be separated for each of the optical sensors,
    the second lower electrodes are provided so as to surround the first lower electrodes, respectively, and
    the lower buffer layer, the active layer, the upper buffer layer, and the upper electrode are provided continuously over the optical sensors so as to cover the first and the second lower electrodes.

2. The detection device according to claim 1, wherein
    the optical sensors are arranged in a matrix having a row-column configuration on the substrate,
    a second transistor is provided for each of the optical sensors so as to be coupled to the first lower electrode of the optical sensor, and
    a gate line and a signal line are provided so as to be coupled to the second transistor.

3. The detection device according to claim 2, comprising a detection circuit coupled to the first lower electrode of the optical sensor via the second transistor and the signal line, wherein
    a common potential is applied to the upper electrode.

4. The detection device according to claim 1, comprising a third transistor configured to switch between coupling and non-coupling between the first lower electrode and the second lower electrode.

5. A detection device comprising:
    a substrate;
    a plurality of optical sensors formed by stacking first and second lower electrodes, a lower buffer layer, an active layer, an upper buffer layer, and an upper electrode on the substrate in the order as listed;
    a first transistor configured to switch between coupling and non-coupling between the first lower electrode and the second lower electrode;
    a potential supply wiring line configured to supply a predetermined potential to the second lower electrode; and
    a second transistor configured to switch between coupling and non-coupling between the second lower electrode and the potential supply wiring line,
    wherein
    the first lower electrodes are arranged so as to be separated for each of the optical sensors,
    the second lower electrodes are provided so as to surround the first lower electrodes, respectively, and
    the lower buffer layer, the active layer, the upper buffer layer, and the upper electrode are provided continuously over the optical sensors so as to cover the first and the second lower electrodes.

6. The detection device according to claim 5, wherein
    the optical sensors each have a first detection mode in which the first transistor is off and the second transistor is on, and
    in the first detection mode, the first lower electrode is decoupled from the second lower electrode by the first transistor, and the second lower electrode is coupled to the potential supply wiring line via the second transistor.

7. The detection device according to claim 5, wherein
    the optical sensors each have a second detection mode in which the first transistor is on and the second transistor is off, and
    in the second detection mode, the first lower electrode is coupled to the second lower electrode via the first transistor, and the second lower electrode is decoupled from the potential supply wiring line by the second transistor.

8. The detection device according to claim 5, wherein
    the optical sensors each have:
    a first detection mode in which the first transistor is off and the second transistor is on; and
    a second detection mode in which the first transistor is on and the second transistor is off, and switching between the first detection mode and the second detection mode is performed based on input from an external switch.

\* \* \* \* \*